US009562725B2

United States Patent
Chao et al.

(10) Patent No.: US 9,562,725 B2
(45) Date of Patent: Feb. 7, 2017

(54) HEAT DISSIPATING DEVICE AND HEAT DISSIPATING FIN

(71) Applicant: Wistron Corporation, Taipei Hsien (TW)

(72) Inventors: Yen-Yu Chao, Taipei Hsien (TW); Ming-Chang Wu, Taipei Hsien (TW); Ming-Wei Tien, Taipei Hsien (TW)

(73) Assignee: WISTRON CORPORATION, New Taipei (TW)

( * ) Notice: Subject to any disclaimer, the term of this patent is extended or adjusted under 35 U.S.C. 154(b) by 196 days.

(21) Appl. No.: 14/072,488

(22) Filed: Nov. 5, 2013

(65) Prior Publication Data

US 2014/0124173 A1 May 8, 2014

Related U.S. Application Data

(63) Continuation of application No. 12/707,057, filed on Feb. 17, 2010, now abandoned.

(30) Foreign Application Priority Data

Oct. 29, 2009 (TW) .............................. 098219983 U

(51) Int. Cl.
| | |
|---|---|
| H01L 23/467 | (2006.01) |
| F28D 15/02 | (2006.01) |
| F28F 1/32 | (2006.01) |
| H01L 23/367 | (2006.01) |
| H01L 23/427 | (2006.01) |
| H01L 23/40 | (2006.01) |

(52) U.S. Cl.
CPC ................ *F28D 15/02* (2013.01); *F28F 1/32* (2013.01); *H01L 23/3672* (2013.01); *H01L 23/427* (2013.01); *H01L 23/467* (2013.01); *F28D 15/0275* (2013.01); *H01L 23/4006* (2013.01); *H01L 2924/0002* (2013.01)

(58) Field of Classification Search
CPC .. H01L 23/367; H01L 23/3672; H01L 23/467; F28F 13/02; F28F 2215/04
USPC .................................................. 165/80.3, 185
See application file for complete search history.

(56) References Cited

U.S. PATENT DOCUMENTS 4,777,560 A * 10/1988 Herrell ................ H01L 23/3672
165/185
5,020,586 A * 6/1991 Mansingh ................. F28F 3/02
165/185

(Continued)

*Primary Examiner* — Devon Russell
(74) *Attorney, Agent, or Firm* — Hunton & Williams LLP

(57) ABSTRACT

A heat dissipating device includes a base, a heat pipe disposed on the base, and a plurality of first and second heat dissipating fins. Each first heat dissipating fin includes a fin body having a first through hole for extension of the heat pipe therethrough. The first and second heat dissipating fins are mounted on the heat pipe in a stack and in a spaced-apart alternating arrangement. Each second heat dissipating fin includes a fin body having a second through hole for extension of the heat pipe therethrough, two adjacent lateral edges, and a cut edge interconnecting the lateral edges such that each second heat dissipating fin has a smaller area than each first heat dissipating fin. Thus, the flow field resistance of the heat dissipating device can be reduced to increase the amount of airflow through the heat dissipating device for enhancing the heat dissipating efficiency.

1 Claim, 15 Drawing Sheets

(56) References Cited

U.S. PATENT DOCUMENTS

| | | | | |
|---|---|---|---|---|
| 5,651,414 | A * | 7/1997 | Suzuki | F28D 15/0275 |
| | | | | 165/104.14 |
| 6,973,962 | B2 * | 12/2005 | Hwang | H01L 23/467 |
| | | | | 165/121 |
| 7,243,708 | B2 * | 7/2007 | Lee | F28D 15/0275 |
| | | | | 165/104.33 |
| 8,225,846 | B2 * | 7/2012 | Lin | H01L 23/3672 |
| | | | | 165/104.33 |
| 8,464,779 | B2 * | 6/2013 | Lin | H01L 23/3672 |
| | | | | 165/151 |
| 2004/0031589 | A1 * | 2/2004 | Lin | H01L 23/467 |
| | | | | 165/80.3 |
| 2004/0200608 | A1 * | 10/2004 | Baldassarre | F28D 15/02 |
| | | | | 165/181 |
| 2005/0284608 | A1 * | 12/2005 | Huang | H01L 21/4878 |
| | | | | 165/80.3 |
| 2005/0286232 | A1 * | 12/2005 | Chen | H01L 23/3672 |
| | | | | 361/710 |
| 2006/0137861 | A1 * | 6/2006 | Wang | H01L 23/4006 |
| | | | | 165/104.33 |
| 2007/0006997 | A1 * | 1/2007 | Hsieh | H01L 23/3672 |
| | | | | 165/104.33 |
| 2009/0139692 | A1 * | 6/2009 | Lin | H01L 23/3672 |
| | | | | 165/80.3 |
| 2010/0307718 | A1 * | 12/2010 | Chen | H01L 23/427 |
| | | | | 165/104.26 |

* cited by examiner

| Airflow (CFM) | Chip surface temperature (°C) | Intake air temperature (°C) | Dissipated wattage (W) | Thermal resistance value (°C/W) | Pressure difference between air intake and exit ends of heat dissipating device (Pa) | Flow resistance value (Pa/CFM²) | Heat dissipating efficiency parameter |
|---|---|---|---|---|---|---|---|
| 30 | 60.9 | 35 | 130 | 0.199 | 13.14 | 0.0146 | 343.8 |
| 25 | 62.2 | 35 | 130 | 0.209 | 10.37 | 0.0166 | 288.1 |
| 20 | 64.1 | 35 | 130 | 0.224 | 7.82 | 0.0196 | 228.5 |
| 15 | 67.3 | 35 | 130 | 0.248 | 5.49 | 0.0244 | 164.9 |

FIG. 3
PRIOR ART

| Airflow (CFM) | Chip surface temperature (°C) | Intake air temperature (°C) | Dissipated wattage (W) | Thermal resistance value (°C/W) | Pressure difference between air intake and exit ends of heat dissipating device (Pa) | Flow resistance value (Pa/CFM$^2$) | Heat dissipating efficiency parameter |
|---|---|---|---|---|---|---|---|
| 30 | 60.9 | 35 | 130 | 0.202 | 12.02 | 0.0134 | 371.5 |
| 25 | 62.5 | 35 | 130 | 0.212 | 9.46 | 0.0151 | 312.3 |
| 20 | 64.4 | 35 | 130 | 0.226 | 7.12 | 0.0178 | 248.4 |
| 15 | 67.6 | 35 | 130 | 0.251 | 4.99 | 0.0222 | 179.8 |

FIG. 9

HEAT DISSIPATING DEVICE AND HEAT DISSIPATING FIN

CROSS-REFERENCE TO RELATED APPLICATION

This application is a Continuation of U.S. patent application Ser. No. 12/707,057, filed Feb. 10, 2010, which claims priority to Taiwanese Patent Application No. 098219983, filed on Oct. 29, 2009, the contents of each are hereby incorporated by reference in their entireties.

BACKGROUND OF THE INVENTION

1. Field of the Invention

The invention relates to a heat dissipating device and heat dissipating fins thereof, more particularly to a heat dissipating device having heat dissipating fins of different shapes which are stacked in a spaced-apart and alternating arrangement.

2. Description of the Related Art

Since an electronic component (such as a central processing unit or operating chip) in a computer system operates at an increased speed, the heat generated thereby also increases. In order to effectively enhance the heat dissipating efficiency of a heat dissipating device, some methods of improvement are to increase the number and area of heat dissipating fins of the heat dissipating device. However, increasing the number and area of the heat dissipating fins will not only increase the overall weight of the heat dissipating device, the flow field resistance will also rise, so that the amount of airflow supplied by a heat dissipating fan will drop when the air passes through the heat dissipating device, which will undesirably lower the heat dissipating efficiency of the heat dissipating device. Accordingly, the rotational speed of the heat dissipating fan has to be increased to overcome the problem of low airflow. However, raising the rotational speed of the fan will result in increased noise.

As shown in FIGS. 1 and 2, a conventional heat dissipating device 1 has a plurality of heat dissipating fins 11, which are generally stacked in a spaced-apart manner and which are secured on heat pipes 12 mounted on a base 10. Moreover, the heat dissipating fins 11 are of the same shape (such as a rectangular shape). During transfer of heat from the heat pipes 12 to the heat dissipating fins 11, since heat cannot be readily conducted to fin portions 111 (such as upper left and lower right corner portions shown in FIG. 2) of each fin 11 that are distal from the heat pipes 12, and since the fin portions 111 have temperatures lower than those of fin portions 112 that are proximate to the heat pipes 12, the heat conducting effect of the fin portions 111 is unsatisfactory, and the heat dissipating efficiency is poor. Furthermore, the fin portions 111 distal from the heat pipes 12 are also a source of flow field resistance, so that the amount of airflow supplied by a heat dissipating fan (not shown) will drop when the air passes through the heat dissipating fins 11 of the heat dissipating device 1 in a direction indicated by the arrows in FIG. 2, thereby lowering the heat dissipating efficiency of the heat dissipating device 1.

FIG. 3 is a comparison table listing various simulation values obtained by numerical simulation computation with respect to the amounts of the airflow which is supplied by the heat dissipating fan and which passes through the heat dissipating device 1. It is apparent from FIG. 3 that the thermal resistance values and the flow resistance values (i.e., flow field resistance) will decrease with an increase in the amounts of airflow passing through the heat dissipating device 1. The heat dissipating efficiency parameter $\eta$ of the heat dissipating device 1 is defined as 1/(thermal resistance value×flow resistance value). If the thermal resistance value and the flow resistance value are small, the heat dissipating efficiency parameter $\eta$ will be large, indicating that the heat dissipating efficiency of the heat dissipating device 1 is high. It can be understood from FIG. 3 that, under different environmental conditions, the heat dissipating efficiency parameter $\eta$ of the heat dissipating device 1 will vary with the thermal resistance value and the flow resistance value.

SUMMARY OF THE INVENTION

The main object of the present invention is to provide a heat dissipating device, in which heat dissipating fins of different shapes are stacked in a spaced-apart alternating arrangement to reduce the flow field resistance of the heat dissipating device and increase the amount of airflow through the heat dissipating device to thereby enhance the heat dissipating efficiency.

Another object of the present invention is to provide a heat dissipating device, in which the heat dissipating fins thereof are configured to have cut edges so as to reduce the overall weight of the heat dissipating device and save materials.

Still another object of the present invention is to provide a heat dissipating fin that is configured to have cut edges so as to reduce flow field resistance and weight.

The objects of this invention and solutions to the technical problems associated with the prior art are realized using the following technical means. The heat dissipating device according to the present invention includes a base, at least one heat pipe, a plurality of first heat dissipating fin units, and a plurality of second heat dissipating fin units.

The heat pipe is disposed on the base. Each of the first heat dissipating fin units includes a first heat dissipating fin that includes a fin body having at least one first through hole for extension of the heat pipe therethrough. Each of the second heat dissipating fin units is mounted on the heat pipe together with the first heat dissipating fin units in a stack and in a spaced-apart alternating arrangement. Each of the second heat dissipating fin units includes a second heat dissipating fin that includes a fin body having at least one second through hole for extension of the heat pipe therethrough, two adjacent lateral edges, and a first cut edge interconnecting the lateral edges such that the fin body of the second heat dissipating fin has a smaller area than the fin body of the first heat dissipating fin.

A shortest distance from the second through hole to the first cut edge is substantially equal to that from the second through hole to one of the lateral edges that are adjoined to the first cut edge, so that the speed of heat conduction from the heat pipe to the said one of the lateral edges is substantially the same as that from the heat pipe to the first cut edge to thereby enhance the heat conducting and heat dissipating effects of the second heat dissipating fin.

The first and second heat dissipating fins of the first and second heat dissipating fin units cooperatively define an air intake end. The first cut edge of the fin body of the second heat dissipating fin of each of the second heat dissipating fin units is located at the air intake end. The first and second heat dissipating fins of the first and second heat dissipating fin units further cooperatively define an air exit end opposite to the air intake end. The fin body of the second heat dissipating fin of each of the second heat dissipating fin units further has another two adjacent lateral edges and a second cut edge that interconnects said another two lateral edges and that is located at the air exit end. Thus, the flow field resistance can be reduced to enhance the heat dissipating efficiency.

A shortest distance from the second through hole to the second cut edge is substantially equal to that from the second through hole to one of the lateral edges that are adjoined to the second cut edge, so that the speed of heat conduction from the heat pipe to said one of the lateral edges adjoining the second cut edge is substantially the same as that from the heat pipe to the second cut edge.

Each of the first heat dissipating fins has a rectangular shape, and each of the second heat dissipating fins has a polygonal shape.

In design, each of the second heat dissipating fin units may include one second heat dissipating fin that is disposed between each adjacent pair of the first heat dissipating fin units, or at least two second heat dissipating fins that are disposed between each adjacent pair of the first heat dissipating fin units. Either arrangement may achieve a reduction in flow field resistance to enhance the heat dissipating efficiency.

The heat dissipating fin according to the present invention includes a fin body having a through hole, two adjacent lateral edges, and a first cut edge interconnecting the lateral edges.

A shortest distance from the through hole to the first cut edge is substantially equal to that from the through hole to one of the lateral edges that are adjoined to the first cut edge.

The fin body of the heat dissipating fin further has another two adjacent lateral edges and a second cut edge interconnecting said another two lateral edges and located opposite to the first cut edge. A shortest distance from the through hole to the second cut edge is substantially equal to that from the through hole to one of the lateral edges that are adjoined to the second cut edge.

The heat dissipating device according to the present invention includes a base, two heat pipes, a plurality of first heat dissipating fin units, and a plurality of second heat dissipating fin units.

The heat pipes are disposed on the base. Each of the first heat dissipating fin units includes a first heat dissipating fin. The first heat dissipating fin includes a fin body having two first through holes for extension of the heat pipes respectively therethrough. The second heat dissipating fin units are mounted on the heat pipes together with the first heat dissipating fin units in a stack and in a spaced-apart alternating arrangement. Each of the second heat dissipating fin units includes at least two second heat dissipating fins that are disposed between each adjacent pair of the first heat dissipating fin units and that are mounted respectively on the heat pipes to cooperatively define an airflow channel between the two second heat dissipating fins. Each of the second heat dissipating fins includes a fin body having a second through hole for extension of a corresponding one of the heat pipes therethrough, and a smaller area than the fin body of the first heat dissipating fin.

The advantages and effects of the present invention reside in that, through the provision of the first and second heat dissipating fin units that are mounted on the heat pipes in a stack and in a spaced-apart alternating arrangement and the configuration of the first and second heat dissipating fins that are of different shapes, and due to the configurations of the second heat dissipating fins that have a smaller area than the first heat dissipating fins, and that have the outer lateral edges thereof disposed relatively close to the heat pipes, the flow field resistance of the heat dissipating device can be reduced and the amount of airflow through the heat dissipating device can be increased to enhance the heat dissipating efficiency. Moreover, the weight of the heat dissipating device can be lowered.

BRIEF DESCRIPTION OF THE DRAWINGS

Other features and advantages of the present invention will become apparent in the following detailed description of the preferred embodiments with reference to the accompanying drawings, of which:

FIG. 3 is a comparison table of simulation values, illustrating the various simulation values obtained by numerical simulation computation after airflow provided by a heat dissipating fan is introduced through the conventional heat dissipating device;

FIG. 9 is a comparison table of simulation values, illustrating the various simulation values obtained by numerical simulation computation after airflow provided by a heat dissipating fan is introduced through the first preferred embodiment of the heat dissipating device according to the present invention;

DETAILED DESCRIPTION OF THE PREFERRED EMBODIMENTS

Figure 1:
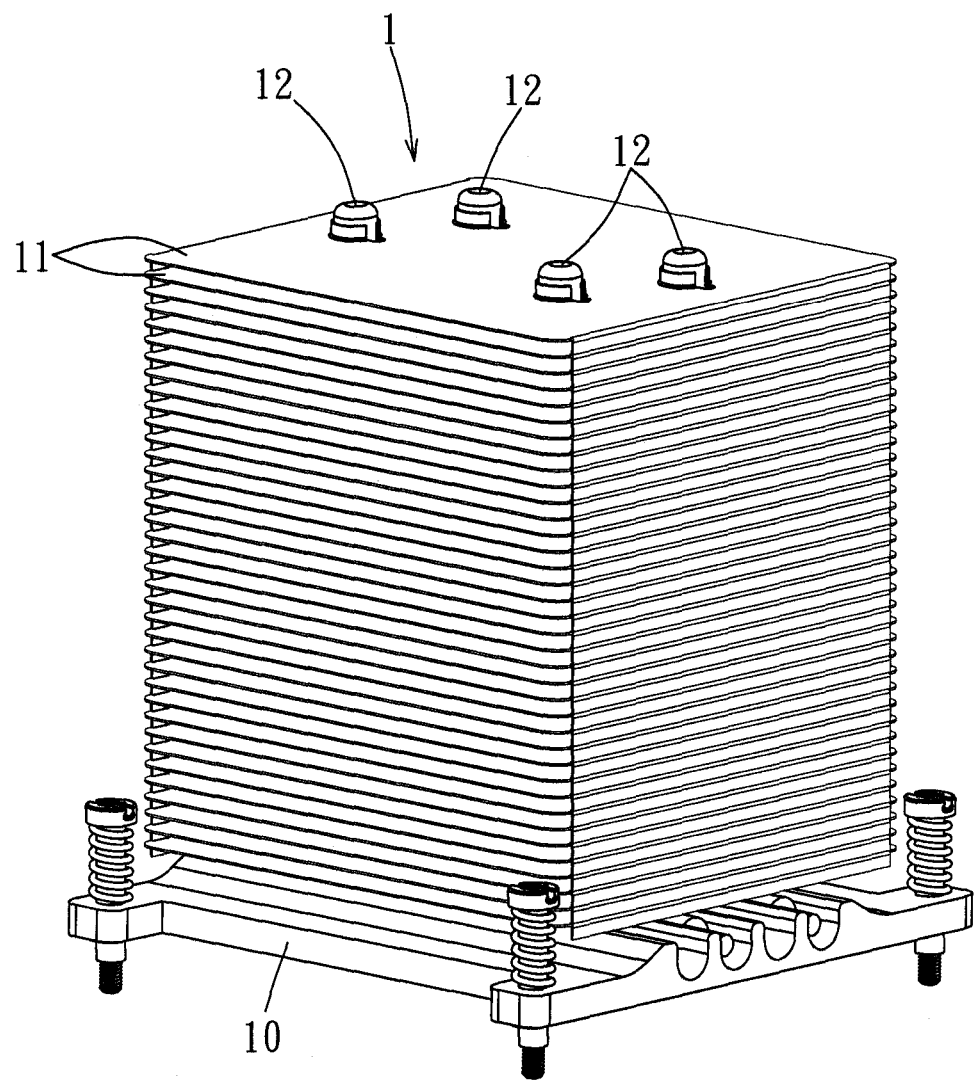
FIG. 1 is a perspective view of a conventional heat dissipating device.
Figure 2:
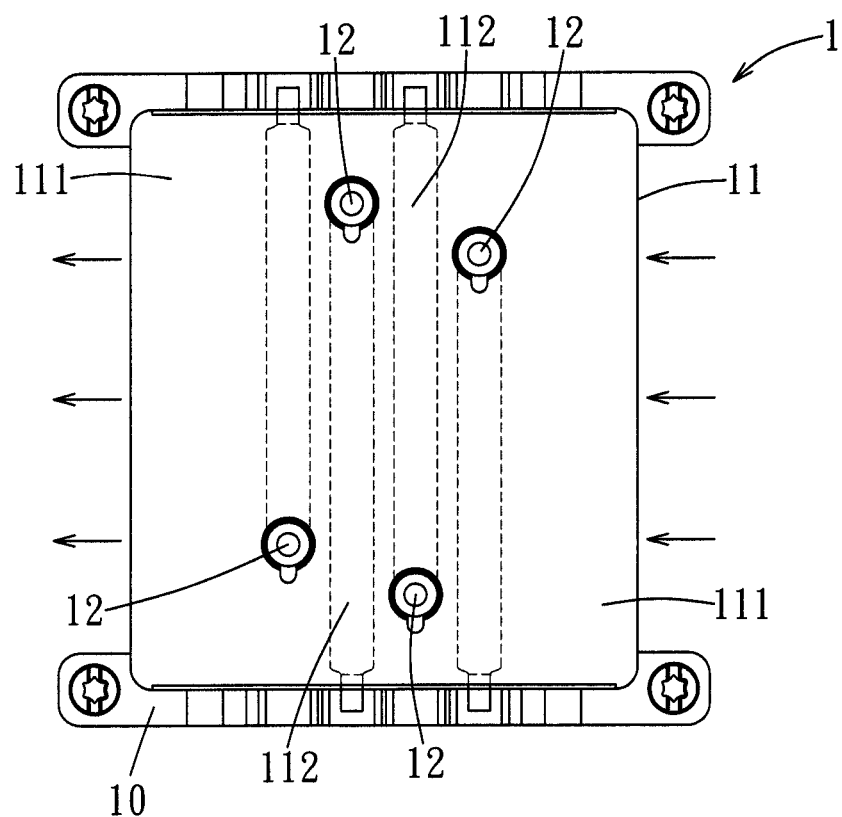
FIG. 2 is a top view of the conventional heat dissipating device, illustrating that the shapes of the heat dissipating fins are the same.

Before the present invention is described in greater detail, it should be noted that like elements are denoted by the same reference numerals throughout the disclosure.

Through a description of the preferred embodiments, the technical means employed by the present invention to achieve the intended objects, and the advantageous effects contemplated thereby, can be better understood and appreciated. It is noted that the accompanying drawings are for illustration and reference only, and are not intended to limit the scope of the present invention.

Figure 4:
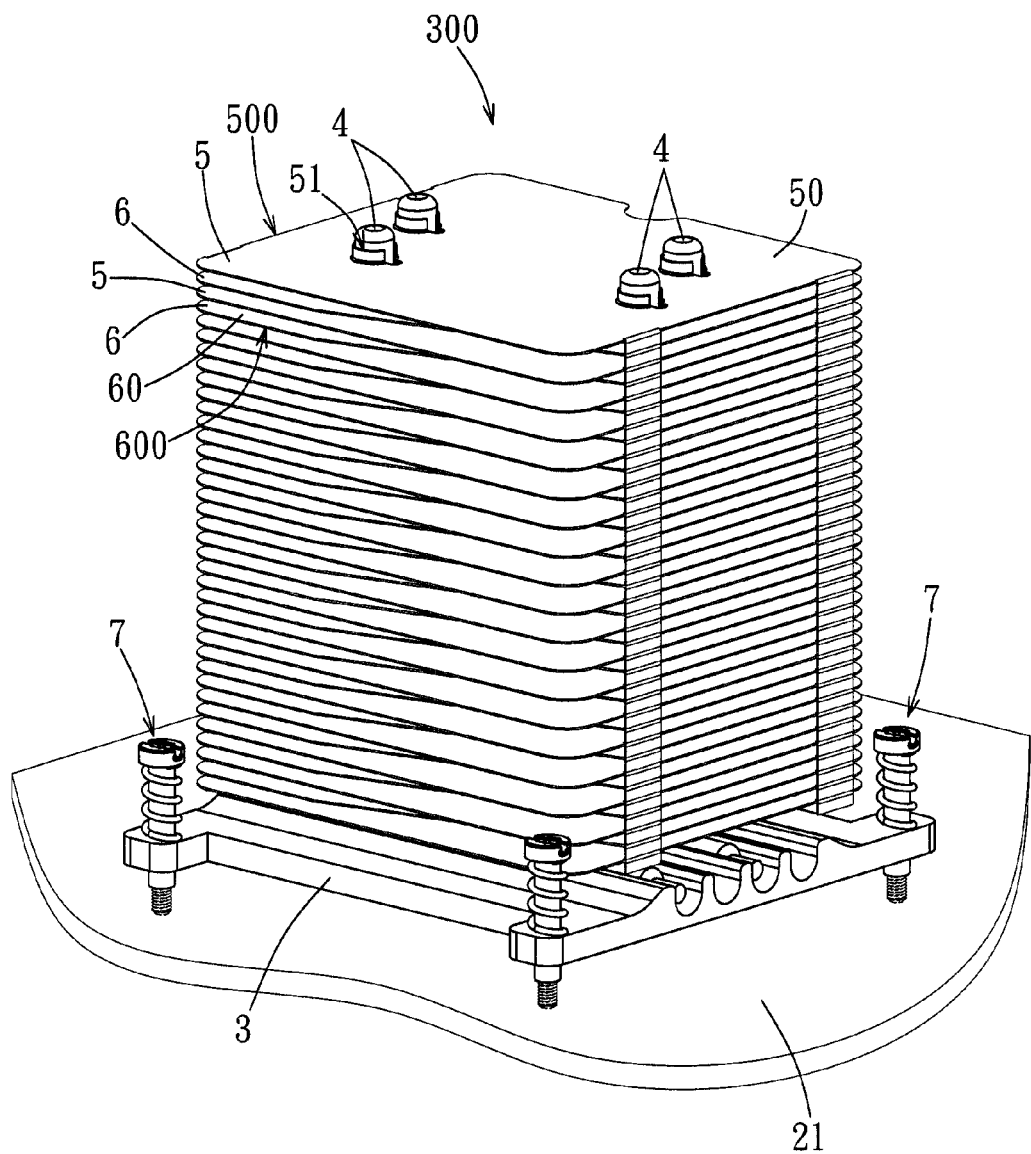
FIG. 4 is a perspective view of the first preferred embodiment of a heat dissipating device according to the present invention when mounted on a motherboard.
Figure 5:
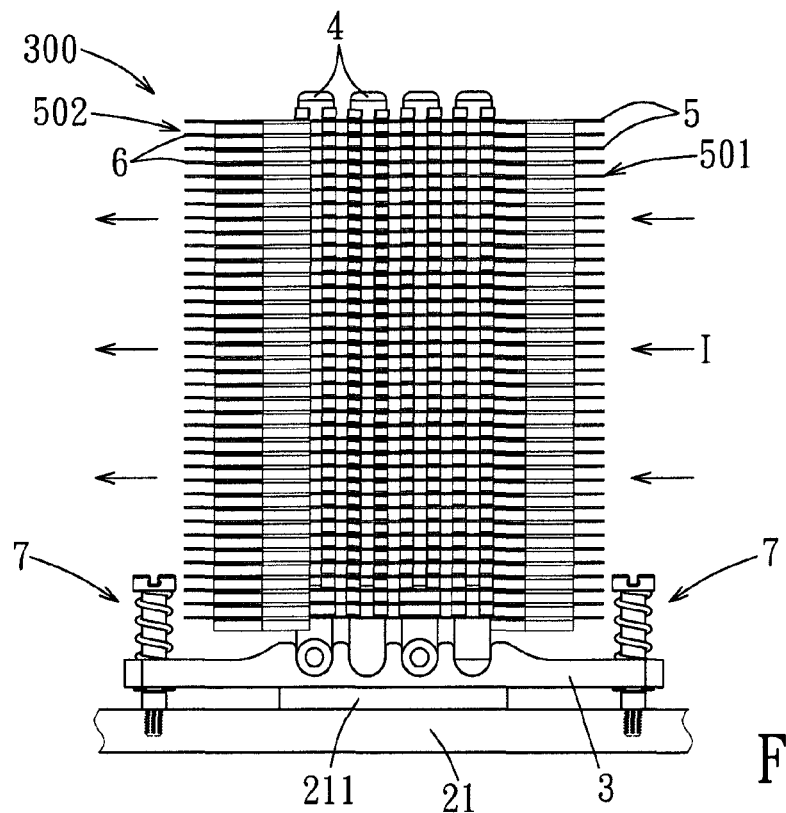
FIG. 5 is a side view of the first preferred embodiment of the heat dissipating device according to the present invention when mounted on the motherboard.
Figure 6:
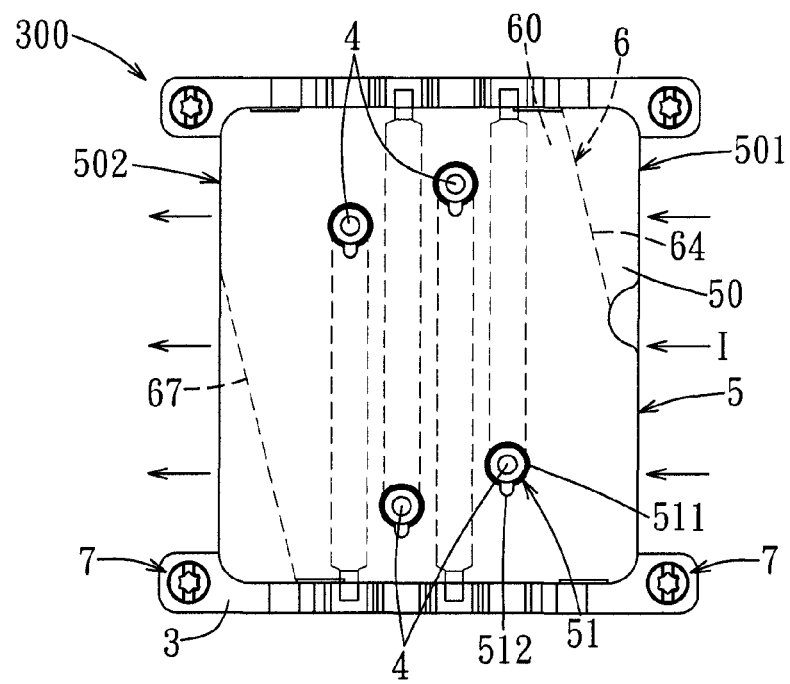
FIG. 6 is a top view of the first preferred embodiment of the heat dissipating device according to the present invention.
Figure 7:
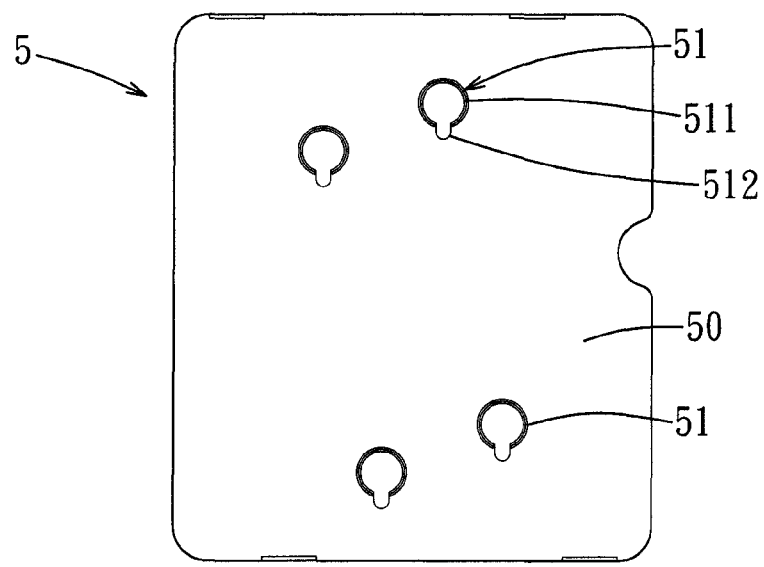
FIG. 7 is a top view of a first heat dissipating fin in the first preferred embodiment of the heat dissipating device according to the present invention.
Figure 8:
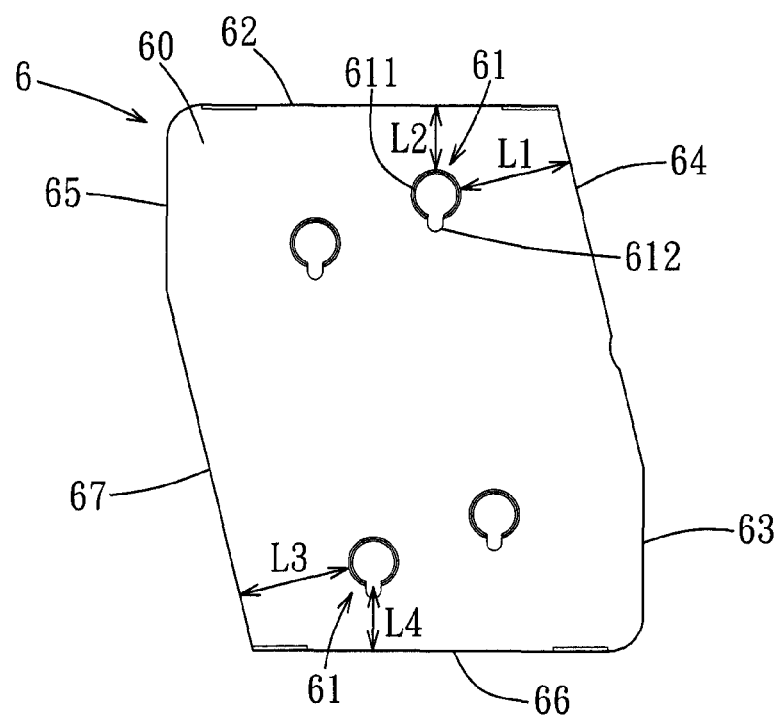
FIG. 8 is a top view of a second heat dissipating fin in the first preferred embodiment of the heat dissipating device according to the present invention.

Referring to FIGS. 4 and 5, the first preferred embodiment of a heat dissipating device 300 according to the present invention is shown to be applied to a server. The heat dissipating device 300 is mounted on a motherboard 21 for dissipating the heat generated by a chip 211 on the motherboard 21. In this embodiment, the chip 211 is exemplified as a central processing unit.

As shown in FIGS. 5, 6, 7, and 8, the heat dissipating device 300 includes a base 3, a plurality of heat pipes 4, a plurality of first heat dissipating fin units 500, and a plurality of second heat dissipating fin units 600. The base 3, the heat pipes 4, the first heat dissipating fin units 500, and the second heat dissipating fin units 600 are all made of a metal material with good heat conductivity, such as copper, aluminum, etc. The heat pipes 4 are soldered to a top face of the base 3 in a spaced-apart arrangement. The base 3 is fastened securely onto the motherboard 21 through a plurality of fastening mechanisms 7 so that a bottom face of the base 3 can abut tightly against a top face of the chip 211. The first heat dissipating fin units 500 and the second heat dissipating fin units 600 are mounted on the heat pipes 4 in a stack and in a spaced-apart alternating arrangement, with one second heat dissipating fin unit 600 disposed between each adjacent pair of the first heat dissipating fin units 500. In this embodiment, each of the first heat dissipating fin units 500 includes a first heat dissipating fin 5 having a rectangular shape and including a fin body 50 that has a plurality of first through holes for extension of the heat pipes 4 respectively therethrough. Each of the first through holes 51 has a large-diameter portion 511 for extension of a corresponding one of the heat pipes 4 therethrough, and a small-diameter portion 512 in spatial communication with the large-diameter portion 511. Each of the second heat dissipating fin units 600 includes a second heat dissipating fin 6. The second heat dissipating fin 6 includes a fin body 60 having a plurality of second through holes 61 for extension of the heat pipes 4 respectively therethrough. Each of the second through holes 61 corresponds in position to a respective one of the first through holes 51, and has a large-diameter portion 611 for extension of the respective one of the heat pipes 4 therethrough, and a small-diameter portion 612 in spatial communication with the large-diameter portion 611. The small-diameter portions 512, 612 of the first and second through holes 51, 61 are disposed to receive tin solders, so that the first and second heat dissipating fin units 500, 600 can be soldered to the heat pipes 4.

The first and second heat dissipating fins 5, 6 of the first and second heat dissipating fin units 500, 600 cooperatively define an air intake end 501 and an air exit end 502 opposite to the air intake end 501. Airflow supplied by a heat dissipating fan (not shown) can enter from the air intake end 501 and flow among the first and second heat dissipating fins 5, 6 and then out through the air exit end 502, thereby cooling the heat pipes 4 and the first and second heat dissipating fins 5, 6 and effectively dissipating the heat conducted from the chip 211 to the heat pipes 4 and the first and second heat dissipating fins 5, 6.

To reduce the flow field resistance of the heat dissipating device 300 so as to increase the amount of airflow provided by the heat dissipating fan that passes through the heat dissipating device 300, in this embodiment, each of the second heat dissipating fins 6 is configured to have a polygonal shape, and the fin body 60 thereof is configured to have two adjacent lateral edges 62, 63 and a first cut edge 64 interconnecting the lateral edges 62, 63. The first cut edge 64 is disposed at the air intake end 501. A shortest distance (L1) from one of the second through holes 61 that is proximate to a juncture between the lateral edge 62 and the first cut edge 64 to the first cut edge 64 is slightly greater than a shortest distance (L2) from said one of the second through holes 61 to the lateral edge 62, so that the heat pipe 4 extending through said one of the second through holes 61 can conduct heat evenly to the lateral edge 62 and the first cut edge 64 to reduce the flow field resistance, thereby resulting in an increase in the amount of airflow through the heat dissipating device 300 for enhancing the heat dissipating efficiency. Preferably, to further lower the flow field resistance of the heat dissipating device 300, the fin body 60 of each of the second heat dissipating fins 6 further has a second cut edge 67 disposed between two adjacent lateral edges 65, 66 which are connected respectively to the lateral edges 62, 63. The second cut edge 67 interconnects the lateral edges 65, 66 and is disposed at the air exit end 502. A shortest distance (L3) from one of the second through holes 61, that is proximate to a juncture between the lateral edge 66 and the second cut edge 67, to the second cut edge 67 is slightly greater than a shortest distance (L4) from said one of the second through holes 61 to the lateral edge 66, so that the heat pipe 4 extending through said one of the second through holes 61 can conduct heat evenly to the lateral edge 66 and the second cut edge 67, thereby further reducing the flow field resistance to result in an additional increase in the amount of airflow through the heat dissipating device 300.

It is particularly noted that each of the second heat dissipating fins 6 can be integrally formed to have the first and second cut edges 64, 67 with the use of a mold. Alternatively, the second heat dissipating fins 6 may be formed from a number of the first heat dissipating fins 5. By cutting off portions of the corresponding first heat dissipating fins 5 that are distal from the heat pipes 4 (or the first through holes 51 through which the heat pipes 4 extend), second heat dissipating fins 6 with the first and second cut edges 64, 67 can be obtained. Due to the provision of the first and second cut edges 64, 67 of each of the second heat dissipating fins 6, each of the second heat dissipating fins 6 has a smaller area than each of the first heat dissipating fins 5 so that, compared with the prior art, the overall weight of the heat dissipating device 300, as well as use of fin material, can be reduced.

Figure 10:
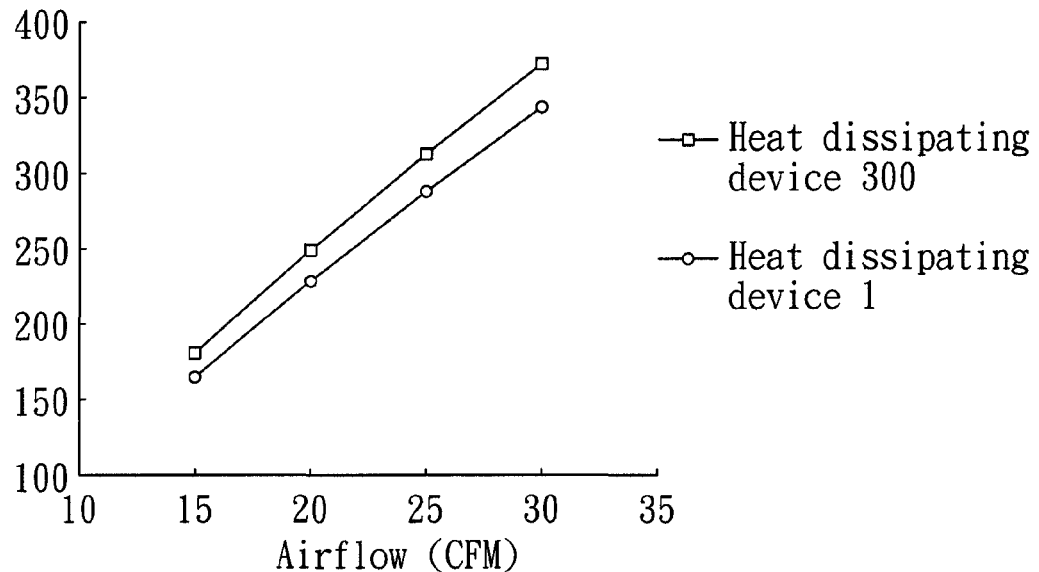
FIG. 10 is a plot illustrating the heat dissipating efficiency parameter of the first preferred embodiment of the heat dissipating device according to the present invention versus the heat dissipating efficiency parameter of the conventional heat dissipating device.

Reference is made to FIGS. 5, 6, 9, and 10. FIG. 9 is a comparison table listing various simulation values obtained by numeric simulation computation with respect to the amounts of airflow supplied by the heat dissipating fan that passes through the heat dissipating device 300 in a direction indicated by the arrows (I). FIG. 10 is a plot illustrating the heat dissipating efficiency parameter of the first preferred embodiment of the heat dissipating device 300 versus the heat dissipating efficiency parameter of the aforementioned conventional heat dissipating device 1. The thermal resistance value in FIG. 9 is equal to (surface temperature of the chip−temperature of the intake air)/dissipated wattage, where the surface temperature of the chip refers to the temperature as measured at the surface of the chip 211 when the chip 211 is in operation, the temperature of the intake air refers to the temperature of the airflow provided by the heat dissipating fan as measured at the air intake end 501 of the heat dissipating device 300, and the dissipated wattage refers to the power generated by the chip 211 when the chip 211 is in operation. The heat dissipating capacity of the heat dissipating device 300 is inversely proportional to the thermal resistance value, and the lower the thermal resistance value, the higher will be the heat dissipating efficiency of the heat dissipating device 300. The thermal resistance value (i.e., the flow field resistance) in FIG. 9 is equal to (a pressure difference between the air intake end 501 and the air exit end 502)/square of the airflow amount (unit: cubic feet per minute), where the amount of airflow passing through the heat dissipating device 300 is inversely proportional to the flow resistance value of the same, and the lower the flow resistance value, the higher will be the amount of airflow passing through the heat dissipating device 300. The heat dissipating efficiency parameter (η) is defined as 1/(the thermal resistance value×the flow resistance value). The heat dissipating efficiency parameter (η) of the heat dissipating device 300 will vary according to changes in the thermal resistance value and the flow resistance value. If the heat dissipating efficiency parameter (η) becomes larger, this indicates that the heat dissipating efficiency of the heat dissipating device 300 becomes higher under a specific environmental condition.

With reference to FIGS. 3, 9 and 10, the various values obtained for the conventional heat dissipating device 1 and the heat dissipating device 300 when the airflow amount is assumed to be 30 CFM are compared under the premise that the values of the airflow amounts, the airflow temperatures, and the dissipated wattage are all the same. Although the thermal resistance value 0.202° C./W measured for the heat dissipating device 300 is slightly larger than the thermal resistance value 0.199° C./W measured for the conventional heat dissipating device 1, the pressure difference 12.02 Pa between the air intake end 501 and the air exit end 502 of the heat dissipating device 300 is smaller than the pressure difference 13.14 Pa between air intake and exit ends of the conventional heat dissipating device 1. Also, the flow resistance value 0.0134 Pa/CFM² measured for the heat dissipating device 300 is smaller than the flow resistance value 0.0146 Pa/CFM² measured for the conventional heat dissipating device 1. Moreover, although the thermal resistance value of the heat dissipating device 300 is slightly larger than that of the conventional heat dissipating device 1, the flow resistance value of the heat dissipating device 300 is significantly reduced, so that the resultant heat dissipating efficiency parameter 371.5 of the heat dissipating device 300 is larger than the heat dissipating efficiency parameter 343.8 of the conventional heat dissipating device 1. Thus, the amount of airflow passing through the heat dissipating device 300 can be increased significantly, so that the airflow can carry away more heat from the heat pipes 4 and from the first and second heat dissipating fins 5, 6 to enhance the heat dissipating efficiency. Furthermore, since the amount of airflow through the heat dissipating device 300 can be increased without raising the rotational speed of the heat dissipating fan, there will not be an increase in the noise generated by the heat dissipating fan.

Referring to FIGS. 1 and 4, for the purpose of comparison, it is assumed that the weights of the base 3, the heat pipes 4, and the first heat dissipating fins 5 of the heat dissipating device 300 are the same as the weights of the base 10, the heat pipes 12 and the heat dissipating fins of the conventional heat dissipating device 1, respectively, and it is further assumed that the number of the heat dissipating fins 11 of the conventional heat dissipating device 1 is equal to the total number of the first and second heat dissipating fins 5, 6 of the heat dissipating device 300. For instance, if the total number of the heat dissipating fins 11 is 37 and the total weight of the heat dissipating fins 11 is 315 grams, and if the total number of the first and second heat dissipating fins 5, 6 is 37 and the total weight thereof is 300 grams, due to the provision of the first and second cut edges 64, 67 on the fin bodies 60 of the second heat dissipating fins 6, the area of each of the second heat dissipating fins 6 is smaller than that of each of the first heat dissipating fins 5, and the total weight of the first and second heat dissipating fins 5, 6 is hence lowered to achieve a weight reduction, so that the load borne by a structure (e.g., the motherboard 21) of the server that supports the heat dissipating device 300 when the heat dissipating device 300 is disposed in the server can be reduced.

Figure 11:
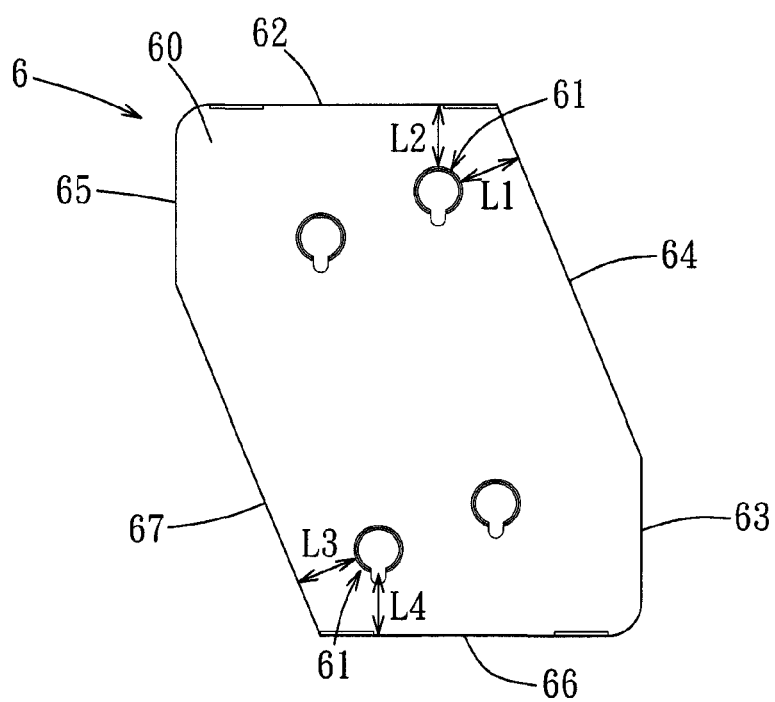
FIG. 11 is a top view of a modified form of the second heat dissipating fin in the first preferred embodiment of the heat dissipating device according to the present invention.

Referring to FIG. 11, to improve the heat conducting and heat dissipating effects of the second heat dissipating fins 6, preferably, in this embodiment, the shortest distance (L1) from the second through hole 61, that is disposed proximate to a juncture between the lateral edge 62 and the first cut edge 64, to the first cut edge 64 is configured to be the same as the shortest distance (L2) between that second through hole 61 and the lateral edge 62. Similarly, the shortest distance (L3) from the second through hole 61, that is disposed proximate to a juncture between the lateral edge 66 and the second cut edge 67, to the second cut edge 67 is configured to be the same as the shortest distance (L4) between that second through hole 61 and the lateral edge 66, so that the speed of heat conduction from the corresponding heat pipe 4 to the lateral edge 62 is substantially the same as that from the same heat pipe 4 to the first cut edge 64, and that the speed of heat conduction from the other heat pipe 4 to the lateral edge 66 is substantially the same as that from the same heat pipe 4 to the second cut edge 67. Thus, the heat conducting and heat dissipating effects of the second heat dissipating fins 6 can be enhanced to avoid the problems of poor heat conduction and poor heat dissipation of the fin portions 111 that are disposed distal from the heat pipes 12 associated with the conventional heat dissipating device 1.

Figure 12:
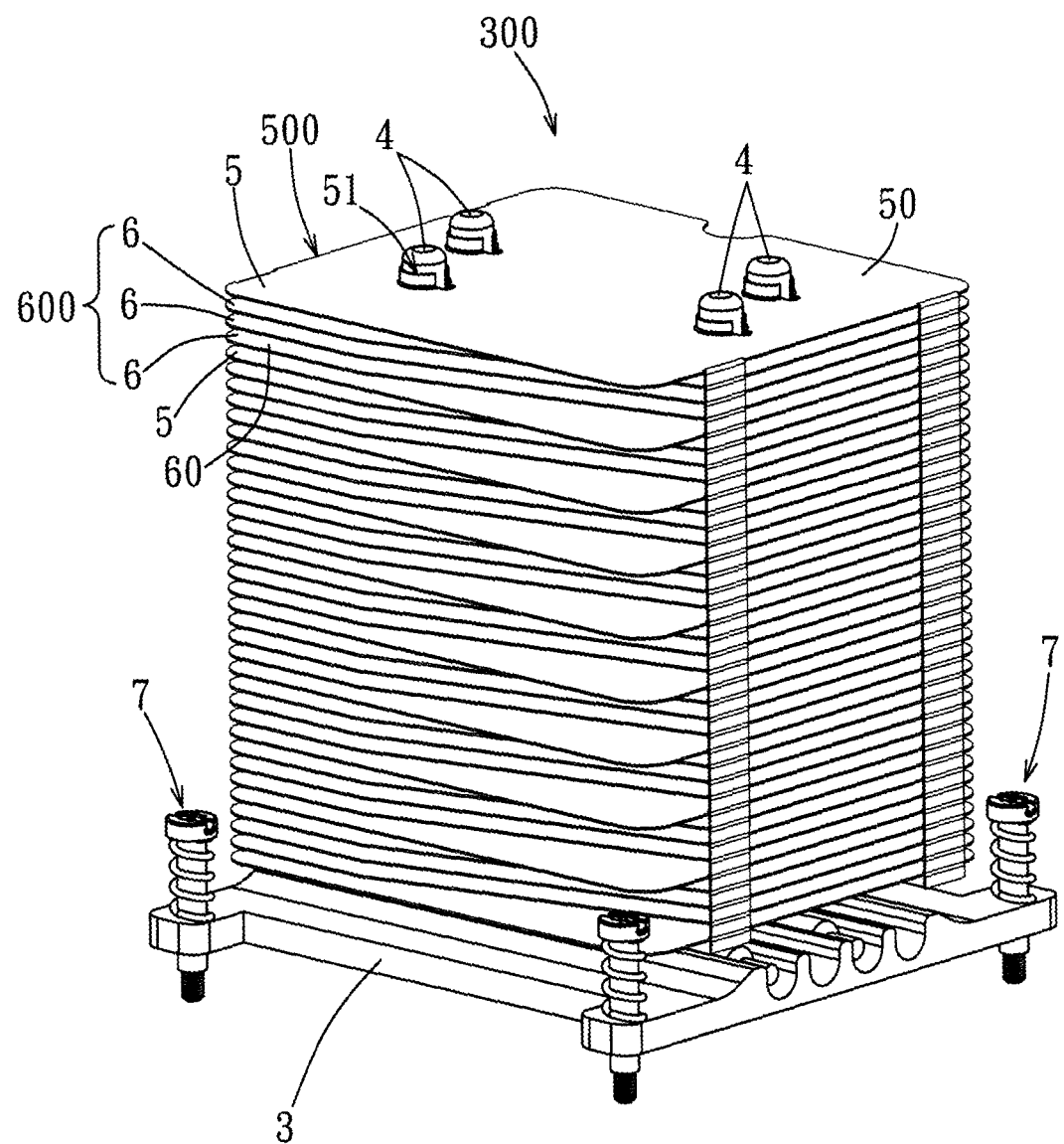
FIG. 12 is a perspective view of a modification of the first preferred embodiment of the heat dissipating device according to the present invention, illustrating that more than two second heat dissipating fins are arranged between each adjacent pair of the first heat dissipating fins.
Figure 13:
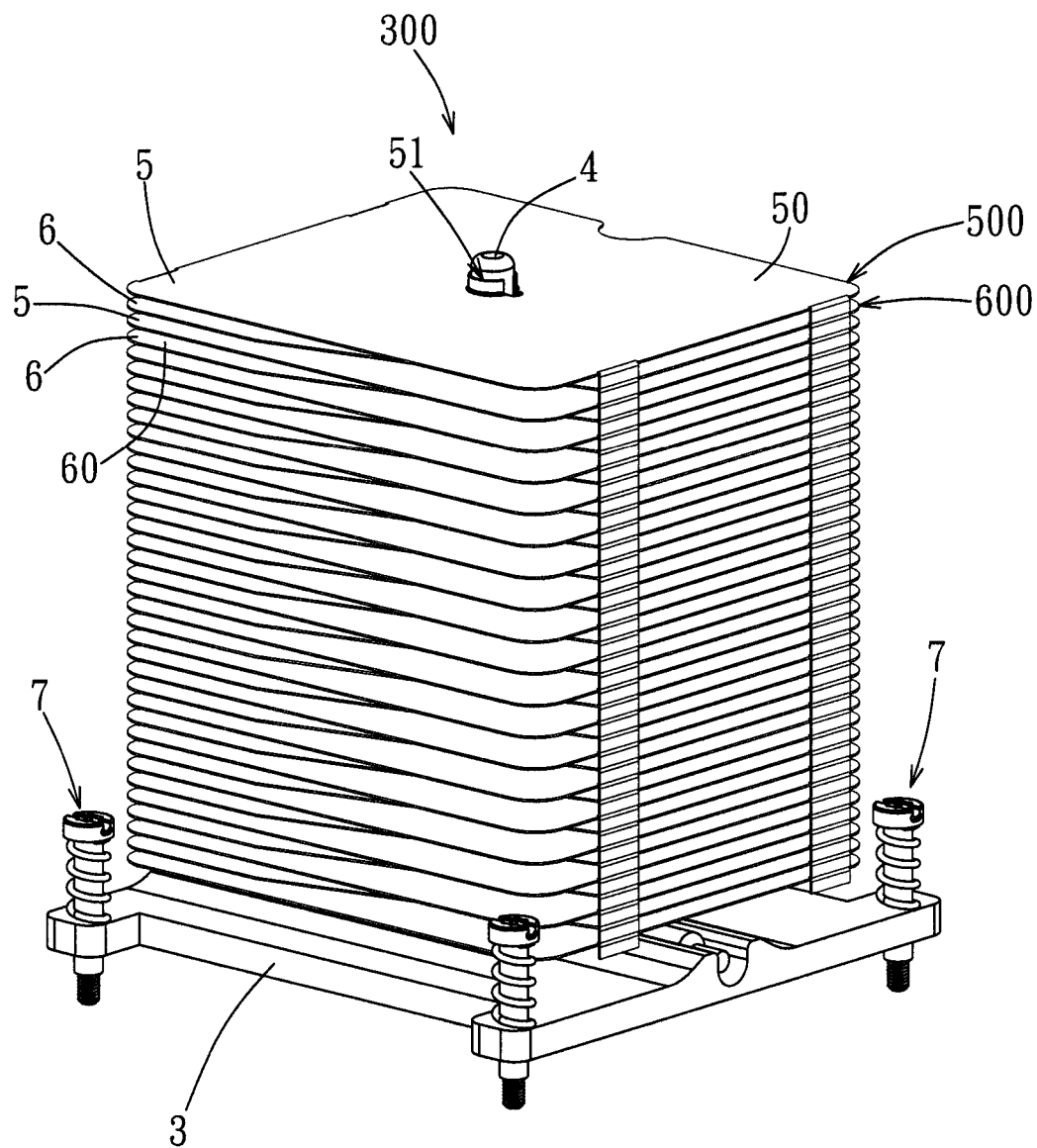
FIG. 13 is a perspective view of another modification of the first preferred embodiment of the heat dissipating device according to the present invention, illustrating that the heat dissipating device includes one heat pipe, and each of the first and second heat dissipating fins has one through hole.
Figure 14:
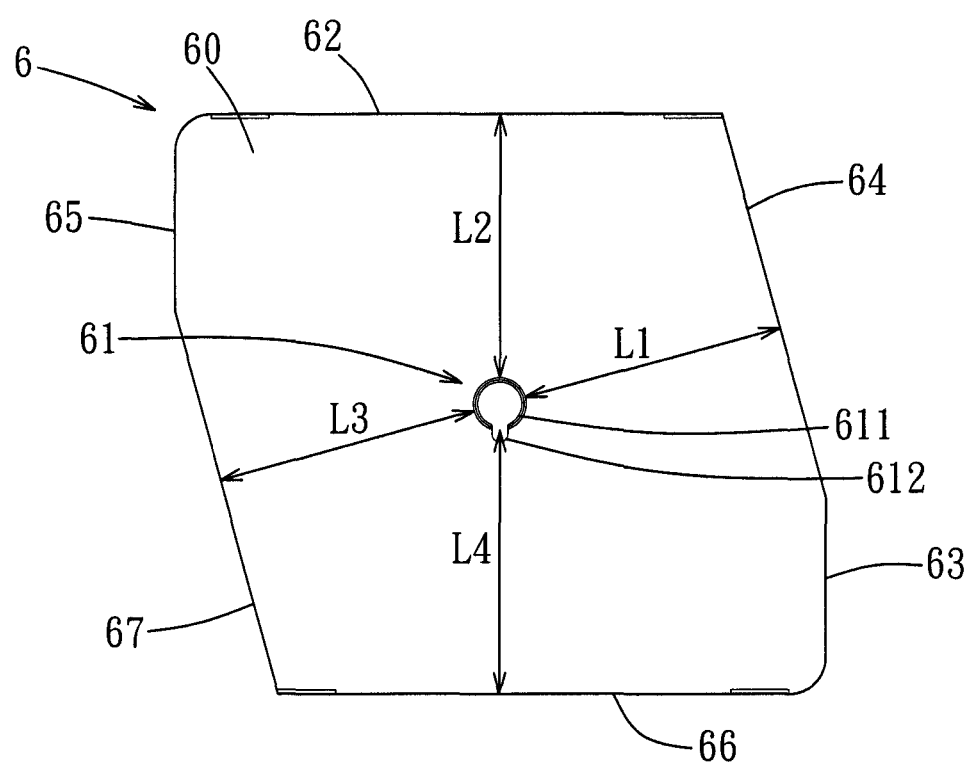
FIG. 14 is a top view illustrating the second heat dissipating fin of the modified first preferred embodiment shown in FIG. 13.

It should be mentioned herein that, although the first and second heat dissipating fin units 500, 600 in this embodiment are exemplified to include one first heat dissipating fin 5 and one second heat dissipating fin 6, respectively, which are arranged in an alternating manner, i.e., one second heat dissipating fin 6 between each adjacent pair of the first heat dissipating fins 5 as shown in FIG. 4, in practice, the second heat dissipating fin unit 600 may include two second heat dissipating fins 6, or more than two second heat dissipating fins 6 (as shown in FIG. 12), which are arranged between each adjacent pair of the first heat dissipating fins 5, and the same effect of enhancing the heat dissipating efficiency through significantly increasing the amount of airflow through the heat dissipating device 300 can still be achieved. Moreover, as shown in FIGS. 13 and 14, the heat dissipating device 300 may be designed to have only one heat pipe 4, and the fin body 50, 60 of each of the first and second heat dissipating fins 5, 6 may be formed with one first or second through hole 51, 61 for extension of the heat pipe 4 therethrough. Preferably, for each of the second heat dissipating fins 6, the shortest distance (L1) between the second through hole 61 and the first cut edge 64 is configured to be the same as the shortest distance (L2) between the second through hole 61 and the lateral edge 62, and the shortest distance (L3) between the second through hole 61 and the second cut edge 67 is configured to be the same as the shortest distance (L4) between the second through hole 61 and the lateral edge 66 so as to promote the heat conducting and heat dissipating effects of the second heat dissipating fins 6.

Figure 15:
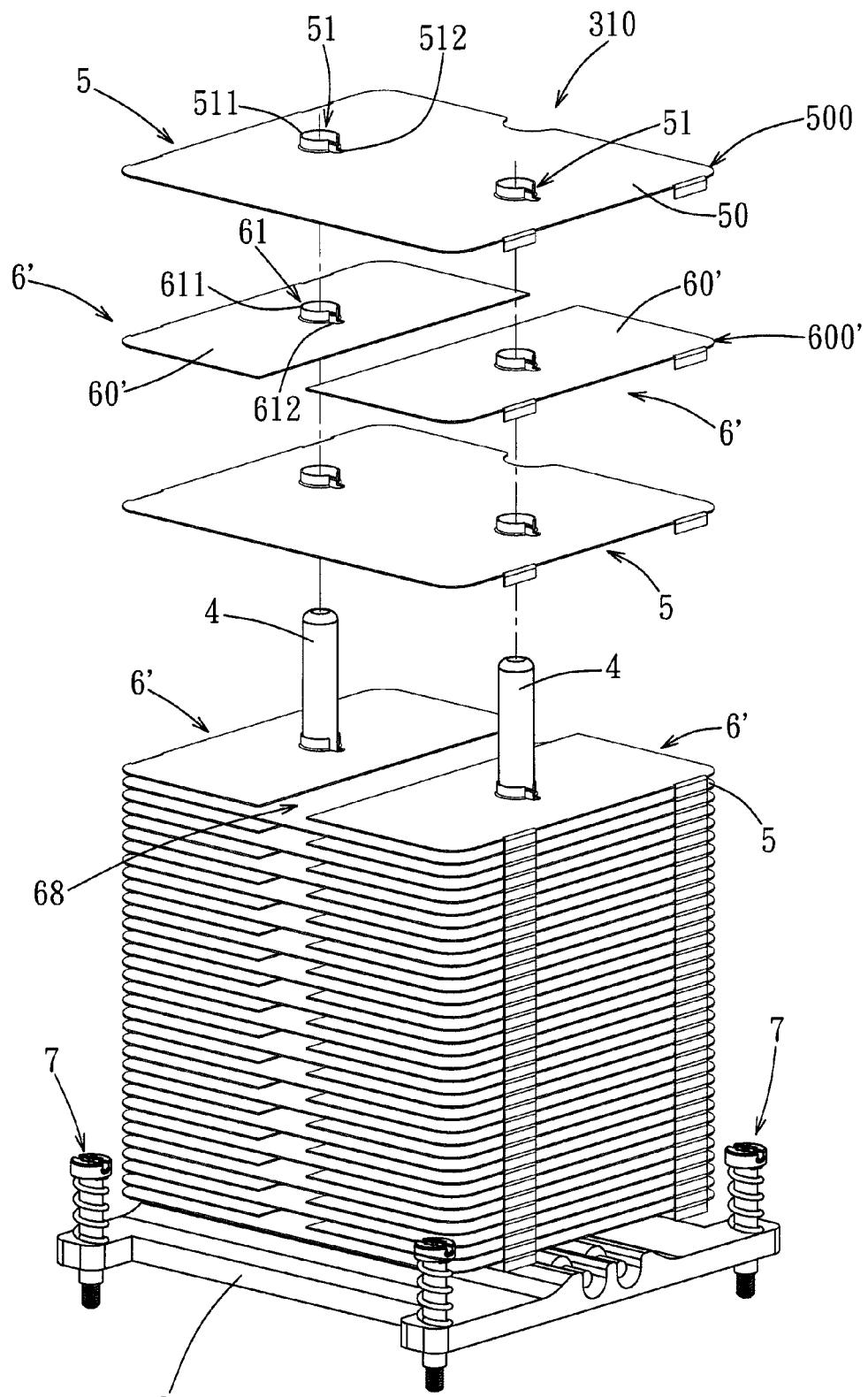
FIG. 15 is a partly exploded perspective view of the second preferred embodiment of the heat dissipating device according to the present invention when mounted on a motherboard.
Figure 16:
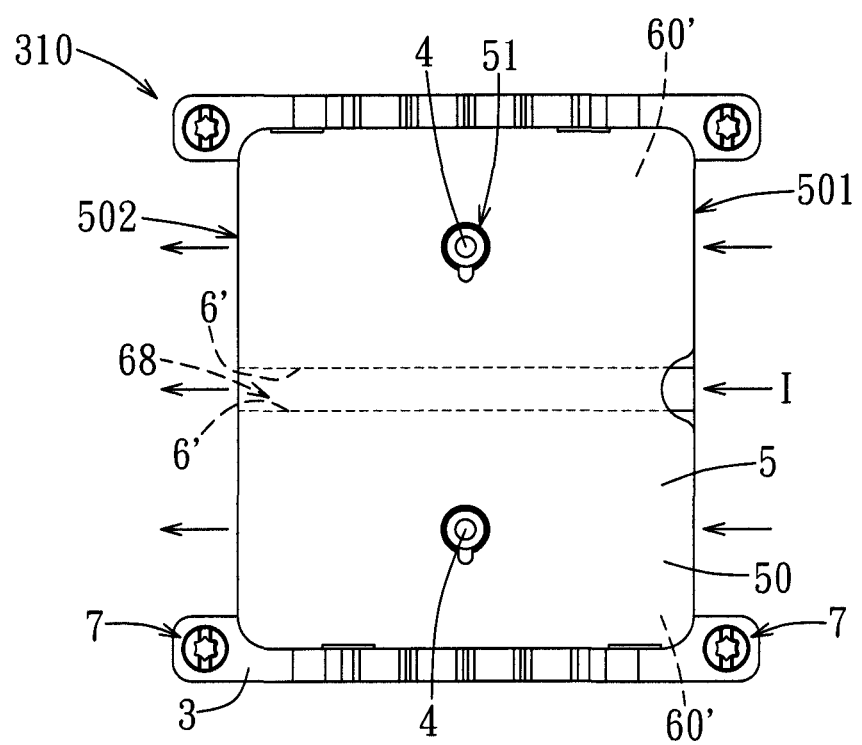
FIG. 16 is a top view of the second preferred embodiment of the heat dissipating device according to the present invention.

Referring to FIGS. 15 and 16, the second preferred embodiment of a heat dissipating device 310 according to the present invention is substantially similar to the first preferred embodiment in overall construction, and differs therefrom in the design of the second heat dissipating fins 6'.

In this embodiment, two spaced-apart heat pipes 4 are disposed on the base 3. Each of the first heat dissipating fins 5 of the first heat dissipating fin unit 500 includes a fin body 50 having two first through holes 51 for extension of the heat pipes 4 respectively therethrough. Each of the second heat dissipating fin units 600' includes two second heat dissipating fins 6'. Each of the second heat dissipating fins 6' includes a fin body 60' having a second through hole 61 for extension of a corresponding one of the heat pipes 4 therethrough. Each of the second heat dissipating fins 6' has a rectangular shape, and has an area smaller than that of each of the first heat dissipating fins 5. The two second heat dissipating fins 6' of each of the second heat dissipating fin units 600' are disposed between each adjacent pair of the first heat dissipating fins 5 at the same level position, are mounted on the respective heat pipes 4, and cooperatively define an airflow channel 68 therebetween. Thus, the airflow provided by the heat dissipating fan can enter into the airflow channel 68 from the air intake end 501 and then flow out through the air exit end 502 to significantly increase the amount of airflow through the heat dissipating device 310 so as to enhance the heat dissipating efficiency.

Figure 17:
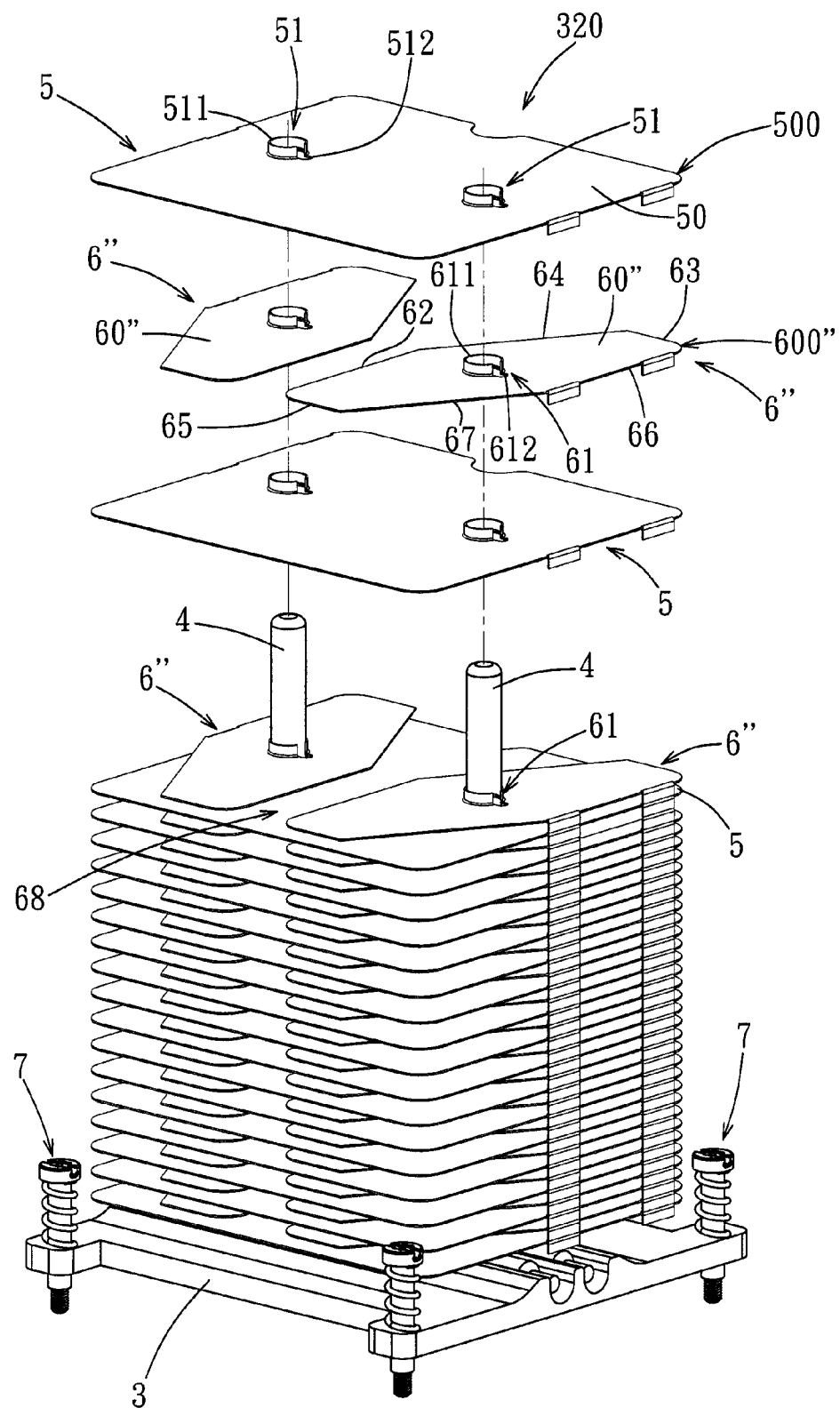
FIG. 17 is a partly exploded perspective view of the third preferred embodiment of the heat dissipating device according to the present invention when mounted on a motherboard.
Figure 18:
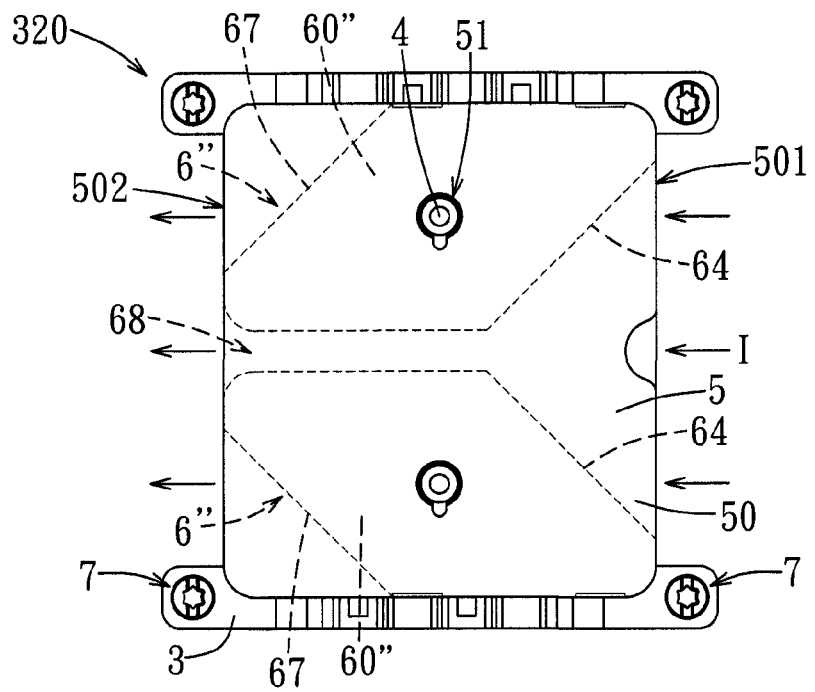
FIG. 18 is a top view of the third preferred embodiment of the heat dissipating device according to the present invention.

Referring to FIGS. 17 and 18, the third preferred embodiment of a heat dissipating device 320 according to the present invention is substantially similar to the second preferred embodiment in overall construction, and differs therefrom in the design of the second heat dissipating fins 6".

Figure 19:
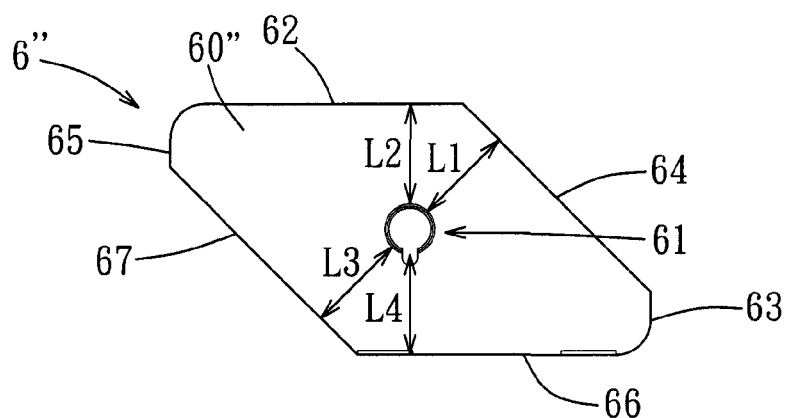
FIG. 19 is a top view of a second heat dissipating fin in the third preferred embodiment of the heat dissipating device according to the present invention.

In this embodiment, the shape of each of the second heat dissipating fins 6" of the second heat dissipating fin unit 600" is similar to that of each of the second heat dissipating fins 6 in the first preferred embodiment, but the area of each of the second heat dissipating fins 6" is smaller than that of each of the second heat dissipating fins 6. Each of the second heat dissipating fins 6" includes a fin body 60" having a first cut edge 64 disposed at the air intake end 501, and a second cut edge 67 disposed at the air exit end 502. The airflow provided by the heat dissipating fan can enter into an airflow channel 68 between each adjacent pair of the second heat dissipating fins 6" from the air intake end 501 and then flow out through the air exit end 502 to significantly increase the amount of airflow through the heat dissipating device 320 so as to enhance the heat dissipating efficiency. Preferably, as shown in FIG. 19, for each of the second heat dissipating fins 6", the shortest distance (L1) between the second through hole 61 and the first cut edge 64 is configured to be the same as the shortest distance (L2) between the second through hole 61 and the lateral edge 62, and the shortest distance (L3) between the second through hole 61 and the second cut edge 67 is configured to be the same as the shortest distance (L4) between the second through hole 61 and the lateral edge 66 so as to enhance the heat conducting and heat dissipating effects of the second heat dissipating fins 6".

In summary, in each of the preferred embodiments of the heat dissipating device 300, 310 and 320 of this invention, through the provision of the first and second heat dissipating fin units 500, 600, 600', 600" that are mounted on the heat pipes 4 in a stack and in a spaced-apart alternating arrangement and the configuration of the first and second heat dissipating fins 5, 6, 6', 6" that are of different shapes, and due to the configurations of the second heat dissipating fins 6, 6', 6" that have a smaller area than the first heat dissipating fins 5, and that have the outer lateral edges thereof disposed relatively close to the heat pipes 4, the flow field resistance of the heat dissipating device 300, 310, 320 can be reduced and the amount of airflow through the heat dissipating device 300, 310, 320 can be increased to enhance the heat dissipating efficiency. Moreover, the weight of the heat dissipating device 300, 310, 320 can be lowered. Thus, the objects of the present invention can be achieved.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:
1. A heat dissipating device comprising:
a base;
two heat pipes disposed on said base;
a plurality of first heat dissipating fin units, each of which includes a first heat dissipating fin that includes a fin body having two first through holes for extension of said heat pipes respectively therethrough; and
a plurality of second heat dissipating fin units mounted on said heat pipes together with said first heat dissipating fin units in a stack and in a spaced-apart alternating arrangement, each of said second heat dissipating fin units including two second heat dissipating fins that are disposed between each adjacent pair of said first heat dissipating fin units and that are mounted respectively on said heat pipes to cooperatively define an airflow channel between said two second heat dissipating fins, each of said second heat dissipating fins including a fin body having a second through hole for extension of a corresponding one of said heat pipes therethrough, and having a smaller area than said fin body of said first heat dissipating fin;
wherein said fin body of each of said second heat dissipating fins has two adjacent lateral edges and a first cut edge interconnecting said lateral edges, said first and second heat dissipating fins of said first and second heat dissipating fin units cooperatively defining an air intake end, said first cut edge of said fin body of each of said second heat dissipating fins being disposed at said air intake end; and wherein said first cut edges of said fin bodies of each of said second heat dissipating fin units are disposed between the corresponding adjacent pair of said first heat dissipating fin units, and cooperatively define a portion of said airflow channel of said second heat dissipating fin unit that is proximate to said intake end and that broadens toward said intake end;

wherein said first and second heat dissipating fins of said first and second heat dissipating fin units cooperatively define an air exit end opposite to said air intake end, said fin body of each of said second heat dissipating fins further having another two adjacent lateral edges and a second cut edge that interconnects said another two lateral edges and that is disposed at said air exit end; and wherein a shortest distance from said second through hole to said first cut edge is substantially equal to that from said second through hole to one of said lateral edges that are adjoined to said first cut edge, and a shortest distance from said second through hole to said second cut edge is substantially equal to that from said second through hole to one of said lateral edges that are adjoined to said second cut edge.

\* \* \* \* \*